United States Patent
Rahman et al.

(10) Patent No.: US 9,136,842 B2
(45) Date of Patent: Sep. 15, 2015

(54) INTEGRATED CIRCUIT DEVICE WITH EMBEDDED PROGRAMMABLE LOGIC

(71) Applicant: ALTERA CORPORATION, San Jose, CA (US)

(72) Inventors: Arifur Rahman, San Jose, CA (US); Bernhard Friebe, La Honda, CA (US)

(73) Assignee: Altera Corporation, San Jose, CA (US)

( * ) Notice: Subject to any disclaimer, the term of this patent is extended or adjusted under 35 U.S.C. 154(b) by 132 days.

(21) Appl. No.: 13/913,096

(22) Filed: Jun. 7, 2013

(65) Prior Publication Data

US 2015/0116001 A1 Apr. 30, 2015

(51) Int. Cl.
  H03K 19/173 (2006.01)
  G06F 1/00 (2006.01)
  H03K 19/003 (2006.01)

(52) U.S. Cl.
  CPC .................................... *H03K 19/003* (2013.01)

(58) Field of Classification Search
  None
  See application file for complete search history.

(56) References Cited

U.S. PATENT DOCUMENTS

| | | | |
|---|---|---|---|
| 4,910,508 A * | 3/1990 | Yamazaki | 326/38 |
| 5,966,032 A * | 10/1999 | Elrabaa et al. | 326/84 |
| 6,260,087 B1 | 7/2001 | Chang | |
| 6,552,410 B1 | 4/2003 | Eaton et al. | |
| 6,694,491 B1 | 2/2004 | Osann, Jr. et al. | |
| 6,856,167 B2 * | 2/2005 | Ozguz et al. | 326/41 |
| 7,265,579 B2 * | 9/2007 | Carlson et al. | 326/41 |
| 7,480,763 B2 | 1/2009 | Pedersen | |
| 7,518,398 B1 | 4/2009 | Rahman et al. | |
| 7,930,661 B1 | 4/2011 | Trimberger et al. | |
| 7,973,555 B1 | 7/2011 | Trimberger et al. | |
| 8,058,897 B1 | 11/2011 | Lu et al. | |
| 8,519,739 B1 * | 8/2013 | Leon | 326/38 |
| 2005/0119549 A1 | 6/2005 | Markas et al. | |
| 2008/0204588 A1 | 8/2008 | Knee et al. | |
| 2010/0001760 A1 | 1/2010 | Balasubramanian et al. | |
| 2012/0280711 A1 | 11/2012 | Landry et al. | |
| 2012/0319717 A1 | 12/2012 | Chi | |
| 2014/0049932 A1 | 2/2014 | Camarota | |

OTHER PUBLICATIONS

Extended EP Search Report mailed Nov. 28, 2014 for EP Application No. 14187541.9.

* cited by examiner

*Primary Examiner* — Crystal L Hammond
(74) *Attorney, Agent, or Firm* — Fletcher Yoder P.C.

(57) ABSTRACT

Systems and methods are provided to enhance the functionality of an integrated circuit. Such an integrated circuit may include a primary circuitry and an embedded programmable logic programmable to adjust the functionality of the primary circuitry. Specifically, the embedded programmable logic may be programmed to adjust the functionality of the primary circuitry to complement and/or support the functionality of another integrated circuit. Accordingly, the embedded programmable logic may be programmed with functions such as data/address manipulation functions, configuration/testing functions, computational functions, or the like.

20 Claims, 5 Drawing Sheets

INTEGRATED CIRCUIT DEVICE WITH EMBEDDED PROGRAMMABLE LOGIC

BACKGROUND

This disclosure relates to integrated circuit devices and, more particularly, integrated circuit devices configured through programmable logic embedded within the integrated circuit devices.

This section is intended to introduce the reader to various aspects of art that may be related to various aspects of these techniques, which are described and/or claimed below. This discussion is believed to be helpful in providing the reader with background information to facilitate a better understanding of the various aspects of this disclosure. Accordingly, it should be understood that these statements are to be read in this light, and not as admissions of prior art.

Integrated circuits are found in a variety of electronic systems. Computers, handheld devices, portable phones, televisions, industrial control systems, and robotics, to name just a few, rely on integrated circuits. For example, a first integrated circuit, such as a field programmable gate array (FPGA), may communicate with a second integrated circuit, such as memory, to carry out certain data processing. In another example, an application-specific integrated circuit (ASIC) may communicate with an optical module to carry out certain data processing.

As technology advances, it is not uncommon for integrated circuits to quickly become out-dated. For example, an industry standard, such as standards for chip-to-chip interfaces, may change. Specifically, this may include changing from a first universal interface block (UIB1) to a second universal interface block (UIB2). In such a case, an integrated circuit utilizing UIB1 may be redesigned to utilize UIB2, which, because of the added cost of redesigning the integrated circuit, may increase the overall cost in producing the integrated circuit. In addition, as described above, integrated circuit devices are utilized in many devices, which may each have specific functional requirements. Accordingly, instead of redesigning the entire integrated circuit, it may be desirable to enhance the functionality of the base integrated circuit.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of this disclosure relate to systems and methods involving enhancing the functionality of an integrated circuit. To enhance the functionality, the integrated circuit may include an embedded programmable logic that is programmable to adjust the functionality of the primary circuitry of the integrated circuit. In this disclosure, the primary circuitry describes the base functionality of the integrated circuit. Specifically, the programmable logic may be programmed through configuration signals received from another integrated circuit and/or a computing device. Thus, the integrated circuit may complement and/or support the functionality of another integrated circuit by being programmed with functions such as data/address manipulation functions, configuration/testing functions, computational functions or the like.

Various refinements of the features noted above may be made in relation to various aspects of this disclosure. Further features may also be incorporated in these various aspects as well. These refinements and additional features may be made individually or in any combination. For instance, various features discussed below in relation to one or more of the illustrated embodiments may be incorporated into any of the above-described aspects of this disclosure alone or in any combination. The brief summary presented above is intended only to familiarize the reader with certain aspects and contexts of embodiments of this disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of this disclosure will be described below. These described embodiments are only examples of the disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of this disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of this disclosure are not intended to be interpreted as excluding the existence of additional embodiments that also incorporate the recited features.

This disclosure generally relates to integrated circuits with embedded programmable logic that enables enhanced functionality in the integrated circuits. Integrated circuits are included in a wide range of devices, such as computers, handheld devices, portable phones, televisions, industrial control systems, robotics, and the like. As such, each of the different devices may have slightly different functionality requirements. For example, a first device may desire for the integrated circuit device, such as memory, to have three read ports and one write port; however, a second device may desire for the integrated circuit to have two read ports and two write points. Thus, the functionality of the integrated circuit in this example may differ slightly.

In addition, as technology advances, the standards and protocols used in devices may also advance. For example, an older integrated circuit may utilize a first universal interface block (UIB1), whereas a newer integrated circuit may utilize an updated second universal interface block (UIB2). As such, it may be difficult to properly interface the older integrated circuit and the newer integrated circuit because of the differing versions of the universal interface block.

Accordingly, the present disclosure includes a programmable logic embedded in an integrated circuit, in which the programmable logic is programmed to increase the functionality of the integrated circuit. Specifically, the functionality of the integrated circuit is increased by implementing data/address manipulation functions, configuration/testing functions, computational functions, or any combination thereof. As used herein, data/address manipulation functions describe access functions, such as incrementing/decrementing memory addresses; configuration/testing functions describe manufacturing and design functions, such as wafer testing integrated circuits; and computational functions describe application specification functions, such as protocol translation and analytics. In other words, programmable logic may be embedded within the integrated circuit to enable the integrated circuit to be adaptable to a range of applications. In addition, the programmable logic may facilitate the interfacing of integrated circuits that may otherwise be incompatible, such as with newer technology. Accordingly, the embedded programmable logic may make integrated circuits more cost efficient to develop because of the expanded applications and lifespan.

Figure 1:
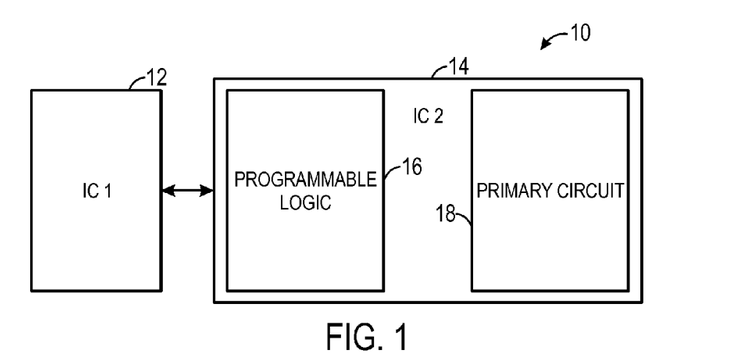
FIG. 1 is a block diagram of a system that includes a first integrated circuit device communicatively coupled to a second integrated circuit with a programmable logic and a primary circuit, in accordance with an embodiment.

By way of introduction, FIG. 1 is a system 10 with at least two integrated circuits. Specifically, as depicted, the system 10 includes a first integrated circuit 12 and a second integrated circuit 14, which may complement the functioning of each other. For example, the second integrated circuit 14 may be a peripheral integrated circuit supporting the first integrated circuit 12 or vice versa. As used herein, the peripheral integrated circuit describes an integrated circuit that supports the functionality of another integrated circuit. Accordingly, the integrated circuits 12 and 14 may be a wide variety of integrated circuits, such as field-programmable gate arrays (FPGA), application-specific integrated circuits (ASIC), system on a chip (SoC), transceivers (e.g., optical module), memory modules and the like.

In addition, the second integrated circuit 14 includes programmable logic 16 and a primary circuitry 18. As depicted, the programmable logic 16 may be embedded in the second integrated circuit 14. As used herein, the primary circuitry 18 describes the base functionality of the second integrated circuit 14. For example, when the second integrated circuit 14 is memory, the primary circuitry 18 may be memory that stores and/or fetches data. To enhance the functionality of the primary circuitry 18, the programmable logic 16 may be programmed to implement functions such as data/address manipulation, configuration/testing, computation, or any combination thereof. The programmable logic 16 may be programmed through various methods. For example, the programmable logic 16 may be programmed via configuration memory. Thus, in some embodiments, the programmable logic 16 may be a field programmable gate array (FPGA) fabric available from Altera Corporation, of San Jose, Calif. Alternatively, the programmable logic 16 may be programmed via metal programmable logic. Thus, in some embodiments, the programmable logic 16 may be HardCopy ASICs, available from Altera Corporation, of San Jose, Calif. Accordingly, it should be appreciated that the method used to program the programmable logic 16 may enable the programmable logic 16 to be statically or dynamically programmed. For example, the programmable logic 16, similar to an FPGA, may be dynamically programmed/reprogrammed during operation. Specifically, the programmable logic may be wholly or partially programmed during operation. On the other hand, the programmable logic 16 may also be statically programmed during power up to retain the same programming during operation.

Figure 2:
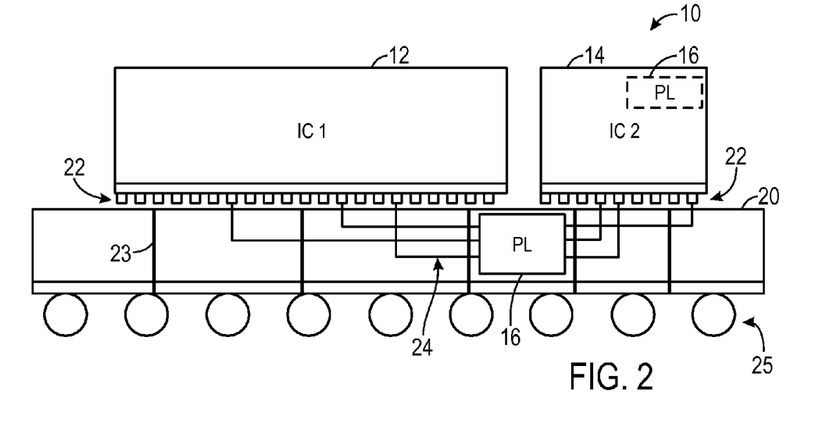
FIG. 2 is a side view of a block diagram of the first integrated circuit and the second integrated circuit of FIG. 1 communicatively coupled, in accordance with an embodiment.

Furthermore, as depicted, the first integrated circuit 12 and the second integrated circuit 14 are communicatively coupled. In some embodiments, the system 10 may utilize a configuration in which the first integrated circuit 12 and the second integrated circuit 14 are both coupled to a printed circuit board (PCB) through a wire bonding process. An alternative configuration, as depicted in FIG. 2, may communicatively couple the first integrated circuit 12 and the second integrated circuit 14 via an interposer 20 (e.g., in a 2.5D configuration). Specifically, the first integrated circuit 12 and the second integrated circuit 14 may communicate through microbumps 22 joined to the interposer 20. The microbumps 22 connect the integrated circuits 12 and 14 to chip-to-chip interconnects 24 within the interposer 20. These chip-to-chip interconnects 24 provide communication channels through various depths of the interposer 20. In some embodiments, as depicted, the interposer 20 may be an active interposer, which enables the programmable logic 16 to be embedded within the interposer 20. Additionally or alternatively, the interposer 20 may be a passive interposer and the programmable logic 16 may be embedded in the second integrated circuit 14. Furthermore, through-silicon vias (TSVs) 23 may connect certain of the microbumps 22 and/or chip-to-chip interconnects 24 to C4 interconnects 25.

Figure 3:
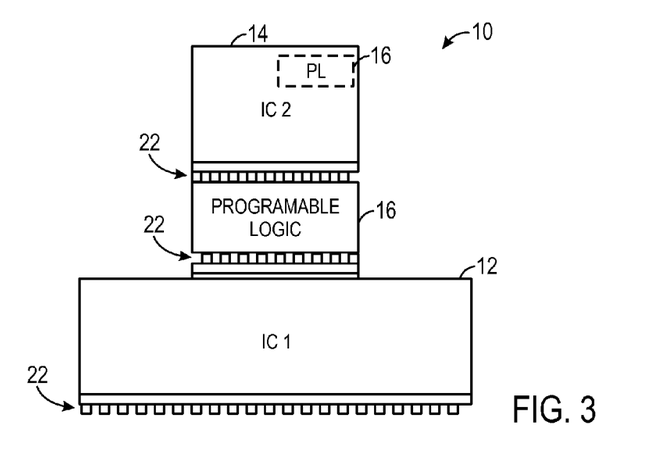
FIG. 3 is a side view of a block diagram of the first integrated circuit and the second integrated circuit of FIG. 1 communicatively coupled, in accordance with an embodiment.

Another alternate configuration of the system 10 is depicted in FIG. 3. As depicted, the second integrated circuit 14 is stacked on the first integrated circuit 12 (i.e., in a 3D configuration). Similar to the embodiment depicted in FIG. 2, the programmable logic 16 may be located between the first integrated circuit 12 and the second integrated circuit 14 (i.e., embedded between the integrated circuits 12 and 14). In addition, microbumps 22 may be used to connect the integrated circuits 12 and 14 to the programmable logic 16. Although not explicitly depicted, it should be appreciated that chip-to-chip interconnects and/or TSVs may run through the programmable logic 16 to provide communication channels between the integrated circuits 12 and 14. Alternatively, the programmable logic 16 may be included in the second integrated circuit 14 similar to FIG. 1, and the integrated circuits 12 and 14 may be directly interconnected via microbumps and/or TSVs.

Figure 4:
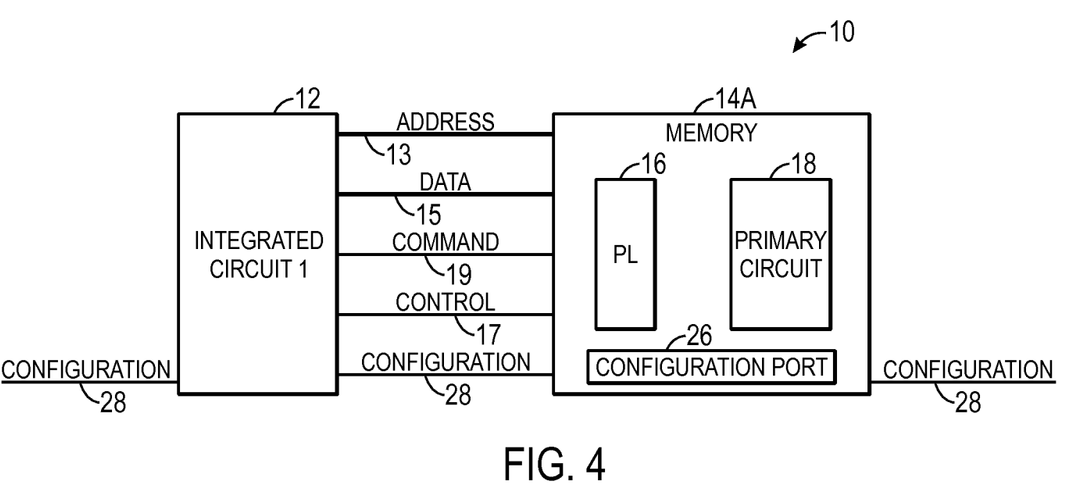
FIG. 4 is a block diagram of the first integrated circuit communicatively coupled to memory, in accordance with an embodiment.

Utilizing one of the above described configurations or another suitable integrated circuit configuration, the first integrated circuit 12 is communicatively coupled to the second integrated circuit 14, such as a memory module 14A, which is depicted in FIG. 4. The memory module 14A may be a single memory die, memory dies stacked with programmable logic, or a stack of memory with embedded programmable logic. In addition, the memory 14A, for example, may be static random-access memory (SRAM), dynamic random-access memory (DRAM), thyristor random-access memory (T-RAM), or any combination thereof. As depicted, the memory 14A includes the programmable logic 16, a configuration port 26, and the primary circuitry 18. As used herein, the primary circuitry 18 refers to the components of the integrated circuit that facilitate the base functions of the integrated circuits. For example, in the memory 14A, the primary circuitry 18 may perform the reading and writing to the memory 14A. Accordingly the memory module 14A may complement and/or support the functionality of an FPGA, an ASIC, or the like (i.e., a peripheral integrated circuit).

In addition, as described above, the first integrated circuit 12 and the memory module are coupled, which may enable the integrated circuits 12 and 14 to communicate address signals, data signals, command signals, control signals, configuration signals, or any combination thereof. Specifically, the address signals may specify an address to read and/or write data, which may be communicated via an address bus 13. Similarly, the data read or to be written may be included in the data signals and communicated via a data bus 15. Furthermore, the control signals and command signals may be communicated via a control bus 17 and a command bus 19. Thus, for example, the first integrated circuit 12 may instruct the memory 14A to perform a specific action, such as reading data at a memory address. In addition, the configuration signals may be communicated via configuration buses 28. As will be described in more detail below, the configuration signals may include instructions to configure the integrated circuits 12 and 14. As depicted, the configuration bus 28 is coupled to the first integrated circuit 12, to the memory 14A, and between the two. Accordingly, the first integrated circuit 12 may receive configuration signals from another device, such as a supervising controller, which instructs the first integrated circuit 12 to transmit a second configuration signal to the memory 14A. Additionally or alternatively, the first integrated circuit 12 may determine itself to send configuration signals to the memory 14A. Likewise, in some embodiments, the memory 14A may directly receive configuration signals from another device. Accordingly, the configuration signals may be communicated between the integrated circuits 12 and 14 or from a controlling device, such as an operator utilizing a computing device to communicate with the integrate circuits 12 and 14.

As described above, the programmable logic 16 may be programmed to enhance the base functions of the memory 14A. Specifically, the programmable logic 16 may implement data/address manipulation functions, configuration/testing functions, computational functions, or any combination thereof. In the memory module, the data/address manipulation functions may include incrementing/decrementing memory addresses, caching data, configuring memory ports, configuring memory modes, controlling the memory, or any combination thereof. The computational functions may include matching patterns, determining statistics, or any combination thereof. The configuration/testing functions may include built-in self-tests, debugging, performance characterization during wafer sort or final testing, or any combination thereof. To facilitate implementing these enhanced functions on the memory 14A the programmable logic 16 may be programmed accordingly through configuration signals. Specifically, the memory 14A may receive configuration signals at the configuration port 26, which is communicatively coupled to the configuration busses 28 carrying the configuration signals.

Figure 5:
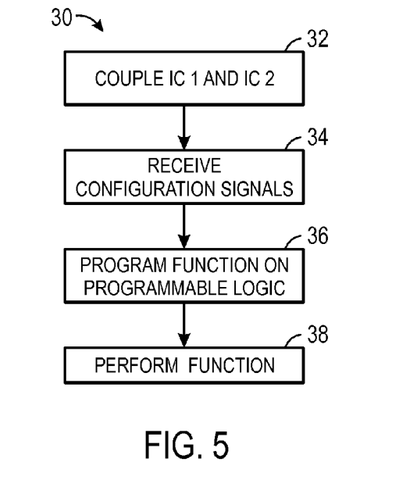
FIG. 5 is a flow chart depicting a process for utilizing the second integrated circuit to enhance the functionality of a first integrated circuit, in accordance with an embodiment.

For example, FIG. 5 illustrates a process 30 for performing functions (e.g., data/address manipulation functions, configuration/testing functions, computational functions) on the second integrated circuit (e.g., memory 14A) 14. The process 30 may begin by coupling the first integrated circuit 12 and the second integrated circuit 14 (process block 32). As described above, the first integrated circuit 12 and the second integrated circuit 14 may be coupled in various manners, such as through to a printed circuit board (PCB) or through an interposer 20. Next, the second integrated circuit 14 may receive configuration signals (process block 34). Specifically, the configuration signals may include instructions relating to the function. Accordingly, the configuration signals may be transmitted to the second integrated circuit 14 from the first integrated circuit 12 or another device based on the function to be implemented in the integrated circuits 12 and 14. Based on the configuration signals, the second integrated circuit 14 may program the function on the programmable logic 16 (process block 36). For example, the programmable logic 16 may be programmed to increment/decrement memory addresses, cache data, configure memory ports, configure memory modes/technologies, controlling the memory, or any combination thereof. It should be appreciated that alternatively block 32 may follow blocks 34 and 36. In other words, the programmable logic 16 may be programmed before being coupled to the first integrated circuit 12. Finally, the programmable logic 16 may perform the function (process block 38).

Figure 6:
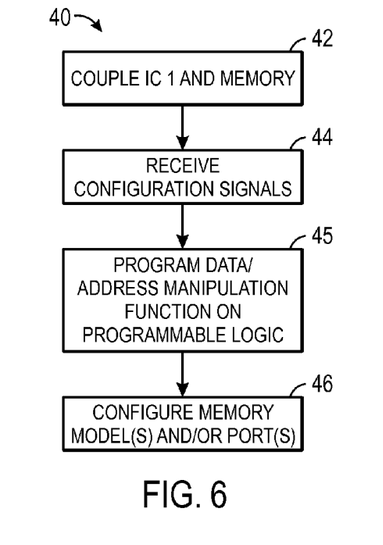
FIG. 6 is a flowchart depicting a process for configuring memory modes and/or memory, in accordance with an embodiment.

To further illustrate implementing functions on the programmable logic, a process 40 for implementing a data/address function (i.e., configuring memory modes and/or memory ports) is depicted in FIG. 6. Specifically, the memory modes and/or memory ports may facilitate the functionality of the first integrated circuit 12. As with process 30, process 40 may begin by coupling the first integrated circuit and the memory 14A (process block 42). In addition, the memory 14A may receive configuration signals (process block 44). For example, the first integrated circuit 12 (e.g., an FPGA or an ASIC) may send configuration signals to the memory 14A, via the configuration bus 28, to instruct the configuration of the memory 14A.

Finally, the programmable logic 16 may be programmed (process block 45) and configure the memory mode(s) and/or memory port(s) accordingly (process block 46). By exploiting the strengths of each memory mode (e.g. SRAM, DRAM, or T-RAM), the memory 14A may be programmed in different modes to better facilitate the functions of the first integrated circuit 12. Specifically, the programmable logic 16 may implement various memory modes in the entire or part of the memory 14A. For example, the programmable logic 16 may configure the entire memory 14A as SRAM, or alternatively, the programmable logic 16 may configure a first portion of the memory 14A to operate as SRAM and a second portion to operate as T-RAM. Similarly, the memory ports may be programmed to alter the read or write bandwidth of the memory 14A based on the functionality of the first integrated circuit 12. Specifically, the programmable logic 16 may configure memory ports as read ports or as write ports. For example, if the memory 14A has four ports, when the first integrated circuit 12 utilizes a larger write bandwidth, the programmable logic 16 may configure three of the memory ports as write ports and one as a read port. Alternatively, if the first integrated circuit 12 utilizes a larger read bandwidth, the programmable logic 16 may configure three of the memory ports as read ports and one as a write port. This configuration may be useful when the first integrated circuit 12 is implementing wireline applications, which utilize a higher read bandwidth than write bandwidth.

Figure 7:
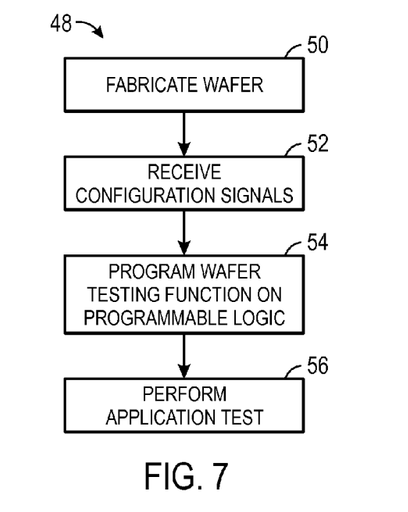
FIG. 7 is a flowchart depicting a process for performing wafer testing, in accordance with an embodiment.
Figure 8:
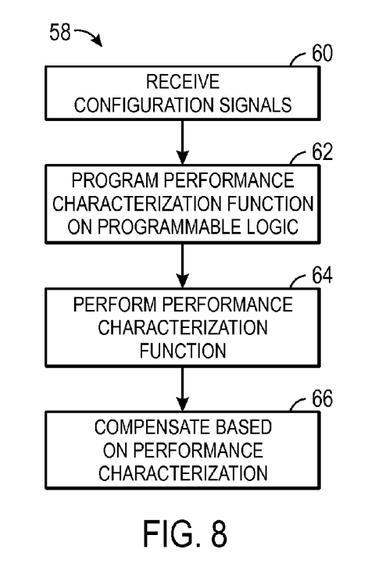
FIG. 8 is a flowchart depicting a process for compensating for the age of the memory, in accordance with an embodiment.

In addition to performing data/address functions, the programmable logic 16 embedded in the second integrated circuit 14 (e.g., memory 14A) may perform configuration/testing functions. For example, as depicted in FIG. 7, the programmable logic 16 may facilitate a wafer testing process 48 during wafer sort testing and/or final testing. The process 48 may begin by fabricating the wafer (process block 50). Specifically, this may include fabricating the primary circuitry 18 and embedding the programmable logic 16. Next, the second integrated circuit 14 may receive the configuration signals (process block 52). During wafer testing, the second integrated circuit 14 may receive configuration signals from a central wafer testing device via the configuration bus 28. In other words, the central wafer testing device may transmit configuration signals to the memory 14A instructing the programmable logic 16 on a wafer testing function. For example, the wafer testing functions may include self-tests, debugging, performance characterization, or any combination thereof. Next, the wafer testing function may be programmed into the programmable logic (process block 54). And finally, the programmable logic 16 may perform the wafer testing function (process block 56). For example, programmable logic 16 may self test the second integrated circuit 14 to determine if the second integrated circuit 14 is functioning properly. Additionally, the programmable logic 16 may be programmed to debug the second integrated circuit 14 when it is not functioning properly.

To further illustrate implementing configuration/testing functions on the memory module 14, FIG. 6 depicts a process 58 for testing the memory's performance and compensating accordingly. For example, it should be appreciated, that as the memory 14A ages, the functioning of the components may begin to regress. Specifically, the capacitors in the memory 14A may begin to store less charge than before. The process 58 may begin by receiving configuration signals (process block 60). The configuration signals may include instructions for characterizing the performance of the memory 14A and instructions to compensate for the performance. Accordingly, the configuration signals may come from the first integrated circuit 12 or another device concerned with the performance of the memory module 14A. For example, a testing device may send configuration signals to various memory modules 14A to test performance of each. Next, the programmable logic 16 may be programmed to run the performance characterization function (process block 62) and the programmable logic 16 may perform the performance characterization function (process block 64). For example, the programmable logic 16 may test each bit to determine whether the memory 14A is properly storing data. Finally, based on the performance characterization, the programmable logic 16 may compensate accordingly (process block 66). For example, if it is determined that the capacitors in the memory 14A are not storing enough charge, the power supplied to the memory module 14A may be increased.

Figure 9:
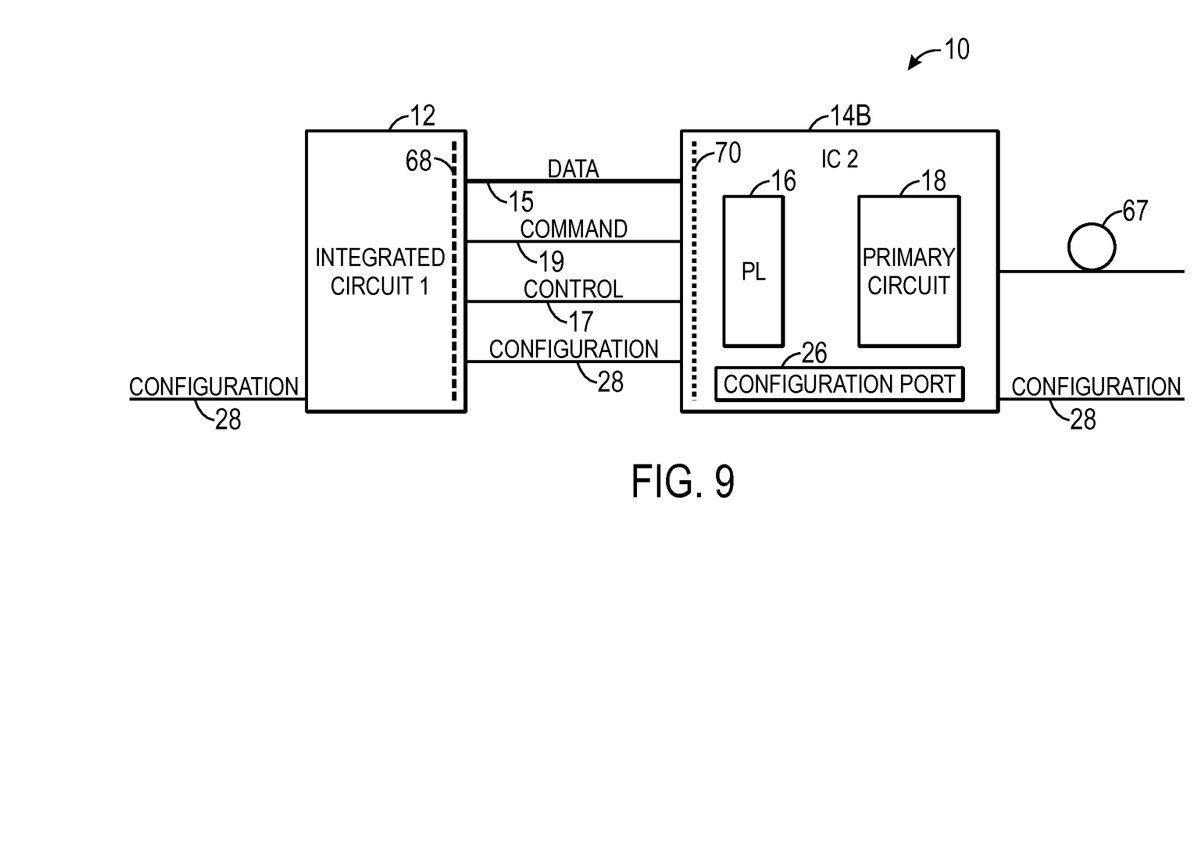
FIG. 9 is a block diagram of the first integrated circuit with a first universal interface block (UIB1) communicatively coupled to a second integrated circuit with a second universal interface block (UIB2), in accordance with an embodiment.

In addition to the memory 14A depicted in FIG. 4, the system 10 may include other embodiments of the second integrated circuit 14. For example, as depicted in FIG. 9, a second integrated circuit 14B may include a chip-to-chip interface. Specifically, the second integrated circuit 14B may be an ASIC or a transceiver (e.g., optical module), such as a Thunderbolt module available from Intel Corporation, of Santa Clara, Calif. Thus, the second integrated circuit 14B may include a data connection 67 (e.g., an optical connector) to couple with an optical cable. Accordingly the second integrated circuit 14B (e.g., optical module) may complement and/or support the functionality of an FPGA, an ASIC, or the like (i.e., a peripheral integrated circuit).

Similar to the embodiment depicted in FIG. 4, the system 10 depicted in FIG. 4 includes the data bus 15 to transmit data between the first integrated circuit 12 and the second integrated circuit 14B. The system 10 also similarly includes the command bus 19 and the control bus 17 to communicate control signals and command signals between the first integrated circuit 12 and the second integrated circuit 14B. In addition, as depicted, the configuration bus 28 is coupled to the first integrated circuit 12, to the second integrated circuit 14B, and between the two to facilitate the transmission of configuration signals. Also similar to the system 10 depicted in FIG. 4, the second integrated circuit 14B includes the programmable logic 16 to enhance the functionality of the primary circuit, the configuration port 26 to receive configuration signals from the configuration bus 28, and the primary circuitry 18. When, for example, the second integrated circuit 14B is a transceiver (e.g., optical IO module or electrical IO module), the primary circuitry 18 may transmit and receive data from other devices.

Figure 10:
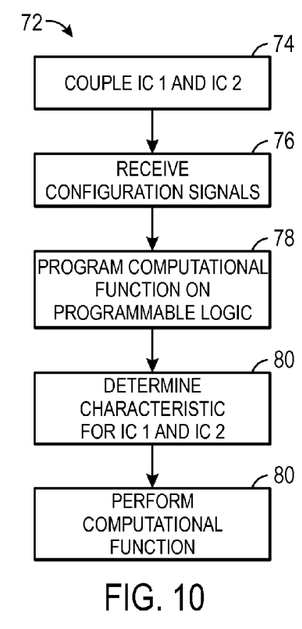
FIG. 10 is a flowchart depicting a process for performing computational functions (e.g., interfacing functions) between the first integrated circuit and the second integrated circuit, in accordance with an embodiment.

Furthermore, as depicted, the first integrated circuit 12 includes a first chip-to-chip interface 68, such as a first universal interface block (UIB1) 68, and the second integrated circuit 14B includes a second chip-to-chip interface 70, such as a second universal interface block (UIB2) 70. Different chip-to-chip interfaces (e.g., 68 and 70) may make it difficult to interface the first integrated circuit 12 and the second integrated circuit 14B because of differences in synchronization, handshaking, throughput matching, interface protocols, and the like. Accordingly, FIG. 10 depicts a process 72 to perform computational functions (e.g., interfacing functions) to facilitate interfacing the integrated circuits (i.e., 12 and 14B). As should be appreciated, UIB1 and UIB2 are merely illustrative and the techniques taught herein may be applied to various chip-to-chip interfaces.

The process 72 may begin by coupling the first integrated circuit 12 and the second integrated circuit 14B (process block 74). As described above, the integrated circuits (i.e., 12 and 14B) may be coupled in varies manners, such as through to a printed circuit board (PCB) or through an interposer 20. Next, the second integrated circuit 14B may receive configuration signals (process block 76). Specifically, the configuration signals may include instructions for performing computational functions, such as converting from UIB1 to UIB2.

Accordingly, the configuration signals may be transmitted from the first integrated circuit 12 or another device. For example, if UIB2 is a newer chip-to-chip interface, it may include a backward compatibility function that instructs older chip-to-chip interfaces (e.g., UIB1) on how to interface with UIB2 70 via the configuration signals. Based on the configuration signals, the programmable logic 16 may be programmed with computational functions (process block 78). Similar to processes described above (i.e., 30 and 40), the second integrated circuit 14B may receive the configuration signals and program the programmable logic 16 before being coupled to the first integrated circuit 12.

The programmable logic 16 may determine operational parameters for both integrated circuits (i.e., 12 and 14B) (process block 80). In other words, the programmable logic 16 determines the operational parameter of the integrated circuits (i.e., 12 and 14B) that may be interfaced. For example, this may include polling the first integrated circuit 12 and the primary circuitry 18 in the second integrated circuit 14A for the chip-to-chip interface used in each. Finally, the programmable logic 16 may perform the computational function (e.g., interfacing function) in the second integrated circuit 14B (process block 82). Following the example presented above, the programmable logic 16 may absorb interface protocol mismatches between chip-to-chip interfaces (e.g., UIB1 and UIB2) to enable seamless integration. More specifically, the programmable logic 16 may adjust the second integrated circuit 14B based on the chip-to-chip interface of the first integrated circuit 12.

Other examples of computational functions may include synchronizing the integrated circuits, facilitating handshaking between the integrated circuits, interface protocol conversion, throughput matching (i.e., aggregation or fanout), and the like. For example, an interface protocol conversion function may convert between an Advanced eXtensible Interface (AXI) interface protocol to an Avalon interface protocol. The AXI interface protocol is available from ARM Holdings PLC, of Cambridge, England, and the Avalon interface protocol is available from Altera Corporation, of San Jose, Calif. Furthermore, when the second integrated circuit 14B is a transceiver such as an optical IO module, the computational functions may further include encryption/decryption, encoding/decoding, forward error correction, signal conditioning, signal detection, and the like. For example, the programmable logic 16 may encrypt data before the primary circuitry 18 sends that data through a data connection 67 (e.g., an optical connector). Conversely, the programmable logic 16 may also decrypt data received from the data connection 67 and pass the decrypted data to the primary circuitry 18. Accordingly, this may enable the second integrated circuit 14B (e.g., transceiver) to communicate with integrated circuits utilizing various encryption/decryption protocols.

Figure 11:
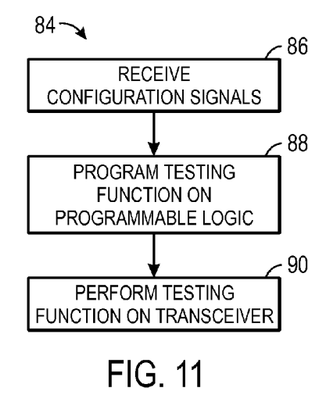
FIG. 11 is a flow chart depicting a process for performing testing functions on a transceiver, in accordance with an embodiment.

Furthermore, similar to the memory module 14A described above, the programmable logic 16 may perform configuration/testing functions in the second integrated circuit 14B. For example, the programmable logic 16 may also test and maintain the transceiver (e.g., optical module) including the data connection 67. Accordingly, a process 84 for testing the second integrated circuited 14B (e.g., transceiver) is depicted in FIG. 11. The process 84 may begin by receiving configuration signals (process block 86). As described above, the configuration files may be transmitted from the first integrated circuit 12 or from another device. In addition, the configuration signals may include instructions for testing the transceiver (e.g., optical module). For example, the configuration signals may instruct the programmable logic 16 to determine whether the data connection 67 is properly representing data that is transmitted. Additionally, the configuration signals may also instruct the programmable logic 16 to maintain the second integrated circuited 14B (e.g., transceiver) in order to reduce the possibility of future malfunctions. The testing functions may be programmed onto the programmable logic 16 (process block 88). And finally, the programmable logic 16 may test the second integrated circuited 14B (e.g., transceiver) (process block 90). Following the example above, the programmable logic may instruct the primary circuitry 18 (e.g., base transceiver) to transmit a known signal and test the data connection 67 to determine if that is in fact what is being transmitted.

Figure 12:
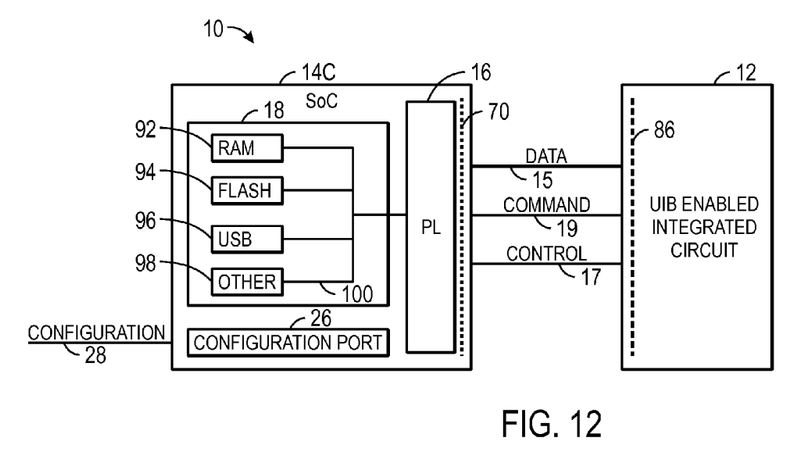
FIG. 12 is a block diagram of a system-on-a-chip (SoC) with the first universal interface block (UIB1) communicatively coupled to a second integrated circuit with the second universal interface block (UIB2), in accordance with an embodiment.

As described above, the system 10 may include various embodiments of the second integrated circuit 14. Another example of the second integrated circuit 14, as depicted in FIG. 12, is a system on a chip (SoC) 14C. Again, similar to the embodiment depicted above, the system 10 includes the data bus 15 to transmit data between the first integrated circuit 12 and the SoC 14C. Furthermore, the system 10 includes the command bus 19 and the control bus 17 to communicate control signals and command signals between the first integrated circuit 12 and the SoC 14C. In addition, as depicted, the configuration bus 28 is coupled to the SoC 14C to facilitate the transmission of configuration signals from another device. Also, the SoC 14C includes the programmable logic 16 to enhance the functionality of the primary circuitry 18, the configuration port 26 to receive configuration signals from the configuration bus 28, and the primary circuitry 18 (i.e., base functions of SoC). Furthermore, as depicted, the first integrated circuit 12 includes the first chip-to-chip interface 68 (e.g., UIB1), and the SoC 14C includes a second chip-to-chip interface 70 (e.g., UIB2).

As should be appreciated, the SoC 14C may integrate various computational functions into a single chip. Accordingly, the primary circuitry 18 of the SoC 14C may include random access memory (RAM) 92, flash memory 94, a universal serial bus (USB) 96, and other components 98. Specifically, the memory (i.e., RAM 92 and flash memory 94) may facilitate the SoC 14C in carry out computational functions and the USB 96 may act as an external interface. In addition, each of these components (i.e., 92, 94, 96, and 98) may be interconnected via a SoC bus 100. For example, the SoC bus 100 may utilize an interface protocol, such as AXI or Avalon described above. In addition to the components (i.e., 92, 94, 96, and 98) included in the SoC 14C, the SoC 14C may interface with peripheral devices (i.e., first integrated circuit 12) via the data bus 15, the command bus 19, the control bus 17, or any combination thereof. For example, the peripherals may be additional memory or a transceiver (e.g., optical IO module or electrical IO module).

Similar to the embodiments described above, the programmable logic 16 may enhance the functionality of the SoC 14C by performing computational functions (e.g., interfacing functions). For example, to facilitate interfacing the SoC 14C with a peripheral device (i.e., first integrated circuit 12), process 72, depicted in FIG. 10, may be utilized. First, the SoC 14C and the peripheral device 12 may be coupled (process block 74). Next, the SoC 14C may receive configuration signals (process block 76). As depicted in FIG. 12, the SoC 14C may receive the configuration signals from another device via the configuration bus 28. Specifically, the configuration signals may instruct the programmable logic to perform a computational function. For example, one computational function may be to change the interface protocol used on the SoC bus 100 to match the interface protocol used in the peripheral device (i.e., first integrated circuit 12) to facilitate interfacing. For example, the programmable logic 16 may change the interface protocol in the SoC bus 100 to Avalon when the interface protocol used in the peripheral device (i.e., first integrated circuit 12) is Avalon. Based on the configuration signals, the programmable logic 16 may be programmed to perform the computational function (i.e., interfacing function) (process block 78). Once programmed, the programmable logic 16 may determine operational parameters of the peripheral (i.e., first integrated circuit 12) and the SoC 14C (process block 80). Depending on the computational function implemented on the programmable logic 16, the programmable logic 16 may poll for various operational parameters. For example, the programmable logic 16 may poll the interface protocols used in the integrated circuits (i.e., 12 and 14C). Specifically, the programmable logic 16 may poll the primary circuitry 18 in the SoC 14C and the peripheral. Finally, the programmable logic 16 may perform the computational function (process block 82).

In a more specific case, when the peripheral device (i.e., first integrated circuit 12) is memory, process 72 may be utilized to adjust the memory modes the SoC 14C may interface with. For example, the programmable logic 16 may adjust the SoC 14C to working with multiple memory modes (e.g., SRAM, DRAM, or T-RAM) to expand the functionality of the SoC 14C.

It should further be appreciated that although each of the embodiments described above included programmable logic 16 in the second integrated circuit 14, the first integrated circuit 12 may also include programmable logic 16 to implement data/address manipulation functions, configuration/testing functions, computational functions, or any combination thereof. Furthermore, as described above, the programmable logic 16 may be programmed via configuration memory, which may enable the programmable logic 16 to be adjusted even after it has been fabricated. For example, this may enable a user to dynamically adjust the functions of an integrated circuit (e.g., second integrated circuit 14) to account for specific applications, newer technology, malfunctioning components, or the like. Additionally, this may even minimize system downtime by enabling integrated circuit (e.g., second integrated circuit 14) to be programmed while still coupled to the system 10. Alternatively, as described above, the programmable logic 16 may be programmed via metal programmable logic, which may enable an integrated circuits manufacturer to adjust the functions of the primary circuitry 18 without redesigning the entire integrated circuit.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A system comprising:
   a first integrated circuit; and
   a second integrated circuit communicatively coupled to the first integrated circuit, wherein the second integrated circuit comprises:
   a primary circuitry; and
   an embedded programmable logic, wherein the embedded programmable logic is embedded in an interposer configured to facilitate communication between the first integrated circuit and the second integrated circuit, embedded in the second integrated circuit, or embedded in both the interposer and the second integrated circuit;
   wherein the first integrated circuit and the second integrated circuit are configured to complement the operation of the other, and wherein the first integrated circuit is configured to adjust the functionality of the primary circuitry of the second integrated circuit by programming the embedded programmable logic.

2. The system of claim 1, wherein the primary circuitry comprises a memory module and the embedded programmable logic is configured to be programmed to an implement a data or address function, wherein the data or address function comprises incrementing a memory address, decrementing a memory address, configuring a memory port, configuring a memory mode, or any combination thereof.

3. The system of claim 1, wherein the primary circuitry comprises a memory module and the embedded programmable logic is configured to be programmed to implement a configuration or testing function, wherein the testing or configuration function comprises a built-in self-test, debugging, a performance characterization, controlling the memory, or any combination thereof.

4. The system of claim 1, wherein the primary circuitry comprises a memory module and the embedded programmable logic is configured to be programmed to implement a computational function, wherein the computational function comprises pattern matching, determining statistics, or any combination thereof.

5. The system of claim 1, wherein the primary circuitry comprises an application-specific integrated circuit and the embedded programmable logic is configured to be programmed to implement a computational function, wherein the computational function comprises synchronizing communication, facilitating handshaking, interface protocol conversion, throughput matching, or any combination thereof.

6. The system of claim 1, wherein the primary circuitry comprises a transceiver and the embedded programmable logic is configured to be programmed to implement a computational function, wherein the computational function comprises interface protocol conversion, encryption, decryption, encoding, decoding, error correction, signal conditioning, signal detection, or any combination thereof.

7. The system of claim 1, wherein the primary circuitry comprises a transceiver and the embedded programmable logic is configured to be programmed to implement a configuration or testing function, wherein the testing function comprises testing the transceiver, maintaining the transceiver, or any combination thereof.

8. The system of claim 1, wherein the primary circuitry comprises a system on a chip and the embedded programmable logic is configured to be programmed to implement a computational function, wherein the computational function comprises interface protocol conversion, memory mode conversion, or any combination thereof.

9. The system of claim 1, wherein the embedded programmable logic is configured to enable a first portion of the embedded programmable logic to be programmed while a second portion of the embedded programmable logic remains substantially the same.

10. The system of claim 1, wherein the embedded programmable logic is configured to be programmed through configuration memory, metal programmable logic, or any combination thereof.

11. The system of claim 1, wherein the embedded programmable logic is configured to be statically programmed.

12. The system of claim 1, wherein the embedded programmable logic is configured to be dynamically programmed.

13. A method for adjusting the functionality of a primary circuitry of an integrated circuit, comprising:
receiving a configuration signal from another integrated circuit, a separate computing device, or both;
programming a function on an embedded programmable logic in the integrated circuit, wherein the function is based at least in part on the configuration signal, and configured to adjust the functionality of the primary circuitry of the integrated circuit; and
performing the function on the embedded programmable logic.

14. The method of claim 13, wherein the primary circuitry of the integrated circuit comprises a memory module and the function comprises a data or address function, wherein the data or address function comprises incrementing a memory address, decrementing a memory address, caching data, configuring a memory port, configuring a memory mode, controlling the memory, or any combination thereof.

15. The method of claim 13, wherein the primary circuitry of the integrated circuit comprises a memory module and the function comprises a computational function, wherein the computational function comprises pattern matching, determining statistics, or any combination thereof.

16. The method of claim 13, wherein the primary circuitry of the integrated circuit comprises a memory module and the function comprises a testing function, wherein the testing function comprises a built-in self-test, debugging, a performance characterization, or any combination thereof.

17. The method of claim 13, wherein the primary circuitry of the integrated circuit comprises an application-specific integrated circuit and the function comprises an interfacing function, wherein the interfacing function comprising synchronizing communication, facilitating handshaking, interface protocol conversion, throughput matching, or any combination thereof.

18. The method of claim 13, wherein the primary circuitry of the integrated circuit comprises a transceiver and the function comprises an interfacing function, wherein the interfacing function comprises serial protocol conversion, encryption, decryption, encoding, decoding, error correction, signal conditioning, signal detection, or any combination thereof.

19. The method of claim 13, wherein the primary circuitry of the integrated circuit comprises a system on a chip and the function includes an interfacing function, wherein the interfacing function comprises interface protocol conversion, memory mode conversion, or any combination thereof.

20. A system comprising:
a first integrated circuit configured to generate a configuration signal; and
a peripheral integrated circuit programmed to support the functionality of the first integrated circuit, wherein the peripheral integrated circuit comprises:
a configuration signal port configured to receive the configuration signal; and
an embedded programmable logic communicatively coupled to the configuration signal port, wherein the programmable logic is configured to be programmed based at least in part on the configuration signal;
wherein the configuration signal includes instructions for programming the embedded programmable logic with a function for supporting the functionality of the primary integrated circuit.

* * * * *